United States Patent [19]
Berger

[11] Patent Number: 4,907,054
[45] Date of Patent: Mar. 6, 1990

[54] MATRIX OF PHOTOSENSITIVE ELEMENTS COMBINING A PHOTOTRANSISTOR WITH A STORAGE CAPACITOR

[75] Inventor: Jean L. Berger, Grenoble, France

[73] Assignee: Thomson-CSF, Paris, France

[21] Appl. No.: 268,334

[22] Filed: Nov. 7, 1988

[30] Foreign Application Priority Data

Nov. 10, 1987 [FR] France ................................. 87 15533

[51] Int. Cl.$^4$ ............................................. H01L 27/14
[52] U.S. Cl. ......................................... 357/30; 357/32; 357/34; 357/23.7; 357/4
[58] Field of Search ...................... 357/32, 30 P, 30 H, 357/34, 23.7, 4

[56] References Cited

U.S. PATENT DOCUMENTS 3,679,826  7/1972  Crowell ............................ 357/30 H
4,633,287  12/1986  Yamazaki ............................ 357/30

FOREIGN PATENT DOCUMENTS 0214033  3/1987  European Pat. Off. .
0233104  8/1987  European Pat. Off. .

OTHER PUBLICATIONS

Patent Abstracts of Japan, vol. 7, No. 255(E-210) [1400], Nov. 12, 1983; & JP-A-58 141 561.

Primary Examiner—Andrew J. James
Assistant Examiner—David Soltz
Attorney, Agent, or Firm—Oblon, Spivak, McClelland, Maier & Neustadt

[57] ABSTRACT

Disclosed is a matrix of photosensitive elements for imaging. This matrix comprises, in series between a row conductor and a column conductor, a capacitor in series with a NIPIN or PINIP type phototransistor. This phototransistor can be made conductive, for the reading of the charges stored in the memory, as easily as a photodiode, even in darkness. The phototransistor is preferably formed by a stacking of N type, intrinsic type, P type, intrinisic type and N type semiconducting layers.

8 Claims, 2 Drawing Sheets

MATRIX OF PHOTOSENSITIVE ELEMENTS COMBINING A PHOTOTRANSISTOR WITH A STORAGE CAPACITOR

BACKGROUND OF THE INVENTION

1. Field of the Invention

The invention concerns arrays or matrices of photosensitive elements.

The standard way to make photosensitive elements is to design a network of row conductors and a network of column conductors with a respective photosensitive element at each intersection of a row and a column. By the network of rows, a selection is made of a row of photosensitive elements for which the output electrical signals have to be known. By the network of column conductors, a respective output signal is read for each of the elements of the selected row.

2. Description of the Prior Art

One method to enable the individual selection of a row, and individual reading on each column, consists in using the association of a photosensitive element as such and an access transistor at each dot of the matrix. The photosensitive element is a photodiode or a phototransistor (the latter having the advantage of greater sensitivity, i.e. it gives a greater electrical charge for the same illumination). This photodiode is connected by means of the access transistor to a column conductor of the matrix. This transistor is controlled by a row conductor (and all the photosensitive elements of the same row are thus connected to the same row conductor).

The drawback of this type of structure is that, at each dot of the matrix, it requires both a photodiode and an access transistor placed beside the photodiode. This structure is bulky because of the area taken up by the access transistor at each dot of the matrix.

To reduce the space factor, i.e. in fact, to increase the definition while housing a greater number of dots in a given area, structures have been proposed wherein the access transistor is eliminated and replaced by a capacitor used, firstly, to store the charges generated by the photodiode and, secondly, to insulate the photodiode from the column conductor when the row corresponding to this photodiode is not selected.

A structure of this type is described, for example, in the French Pat. No. 86 00716. The advantage of the capacitor, as compared with the transistor, is that it can be placed on top of the photodiode and not beside it, thus reducing the space factor.

The drawback here is that the charges stored at each dot can no longer be read as simply as when there is an access transistor which it is enough to make conductive in order to connect the photodiode to a column conductor of the matrix. With a structure having no more than one photodiode and one capacitor, it is the photodiode itself that has to be made conductive by directly biasing it for the brief instant for which the reading lasts, so as to remove the charges, stored in the capacitor, to the column conductor (or to bring a compensation charge for the stored charges through the column conductor).

It is important to note that, in principle, this type of structure prohibits the use of phototransistors instead of photodiodes for, unlike the photodiode which can be made conductive by simple direct biasing under low voltage, the phototransistor cannot easily be made conductive without action being taken on its base. Now, in principle, its base is floating (if it were not, we would be back with a complicated structure which was sought to be avoided). To make the phototransistor conductive in darkness without acting on the base, it is necessary to make its base-emitter junction go into avalanche mode by applying a high voltage to it between the collector and the emitter, and this is all the more undesirable as it would introduce considerable noise into the signal which is to be read.

SUMMARY OF THE INVENTION

However, it would be desirable to use a phototransistor instead of a photodiode to increase the sensitivity of the device without losing in terms of definition. For, it will be understood that, if the goal is to reduce the space factor, this goal implies using as small a photodiode as possible but that the sensitivity is proportionate to the area of the photodiode.

To obtain a better compromise between sensitivity and definition, the present invention proposes the use of a matrix of photosensitive elements wherein each dot of the matrix comprises, between a row conductor and a column conductor, a capacitor in series with a photosensitive element formed by a phototransistor capable of being made conductive as easily as a photodiode even in darkness. The preferred structure of this phototransistor is a superimposition of semiconducting layers which are alternately doped in the following way:
doping of a first type of conductivity;
the absence of doping (intrinsic or almost intrinsic semiconductor);
doping of the second type of conductivity;
absence of doping (intrinsic or almost intrinsic semiconductor);
doping of the first type of conductivity;
the photosensitive element is series-connected with a capacitor comprising a dielectric layer in contact with one of the farthest semiconducting layers of the superimposition, and the series-connected set comprising the phototransistor and the capacitor is placed between a row conductor and a column conductor.

The absence of doping refers herein to the absence of doping capable of increasing the free carrier content, but this does not exclude hydrogen or carbon doping for reasons which shall be explained further below.

Although it may be considered that a phototransistor structure with five superimposed layers is known, this structure finds an unexpected application herein in a matrix structure without access transistor whereas, in principle, the use of a phototransistor is incompatible with a matrix structure of this type.

The phototransistor can be made by the local stacking of five superimposed layers, and a capacitor is also superimposed on the same place thus making it possible to minimize the space occupied by each dot of the matrix.

Experience shows that, unlike in other prior art phototransistor structures, this five-layer structure can be incorporated into a matrix without any access transistor. Now, the sensitivity of the five-layer NIPIN or PINIP phototransistor is greater than that of a standard PIN type photodiode for an equivalent area. The phototransistor can be easily turned on, for the reading of the charges stored in the capacitor, through the application of a low bias voltage (of the same magnitude as for a PIN diode) even in darkness. Moreover, this turning on of the phototransistor is not accompanied by the injection of a great deal of noise (stray signals not generated by the illumination of the phototransistor) on the column conductor.

One of the two intrinsic layers is far thinner than the other one. Preferably it is at least ten times thinner. The thinnest layer preferably has a thickness of 200 angstroms or less.

The dielectric layer of the capacitor may be placed either on the thin intrinsic layer side or on the thicker intrinsic layer side. Furthermore, it can be placed either beneath the photosensitive element or above it.

The invention can be applied to the making of linear or matrix photosensitive detectors and also to the making of X-ray image detectors in which a scintillating layer converts incident X-rays into light rays in a range of wavelengths to which the phototransistor NIPIN or PINIP is sensitive.

BRIEF DESCRIPTION OF THE DRAWINGS

Other characteristics and advantages of the invention will emerge from the following detailed description, made with reference to the appended figures, of which.

DESCRIPTION OF PREFERRED EMBODIMENTS

Figure 1:
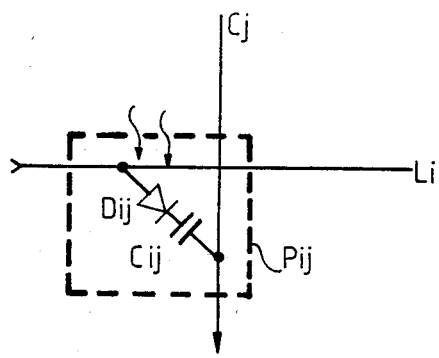
FIG. 1 shows a symbolic view of a dot of a matrix of photosensitive dots, of a prior art type wherein a photodiode is placed in series with a capacitor between a row and a column of the matrix.

FIG. 1 shows a symbolic view of a dot of a prior art matrix of photosensitive dots. This matrix has a certain number of rows and columns, and each photosensitive dot Pij is located at the intersection of an order i row Li and an order j column Cj.

The row Li takes the form of a "horizontally" oriented electrical conductor, and the column Cj takes the form of a vertically oriented conductor Cj.

The photosensitive dot has a photodiode Dij, series-mounted with a capacitor Cij. This series-mounted set is connected between the row conductor Li and the column conductor Cj.

When the photodiode is illuminated, electrical charges are generated and stored at the junction point between the diode and the capacitor. It is seen to it that, during the illumination, the diode is reverse biased for both a low illumination and a high illumination (within the normal operating limits permitted for the matrix).

Outside the illumination stage, the stored charges are read by directly biasing the diode for a short instant. This direct biasing is done by carrying the row conductor to an appropriate potential, and enables the transfer of the stored charges to the column Cj which is connected to a read amplifier.

The photodiode Dij is a PIN diode with good photoelectrical characteristics.

Figure 2:
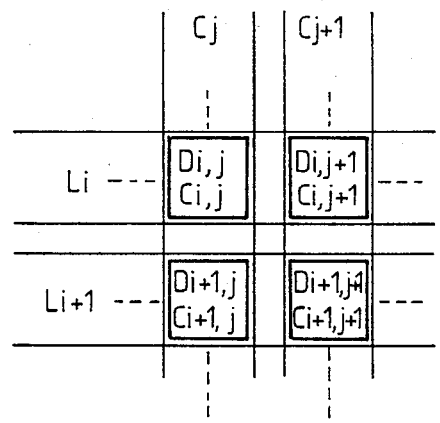
FIG. 2 shows a top view of the geometrical configuration of a few dots adjacent to the matrix.

FIG. 2 shows a top view of the geometrical configuration of the matrix. This configuration may be highly compact, for the photodiode (Dij) and the capacitor (Cij) are made by the simple stacking of semiconducting layers (for the diode) and insulating layers (for the capacitor) between the row conductors and the column conductors. For more details on this prior art technique, the French Pat. No. 86 00716 may be referred to.

Figure 3:
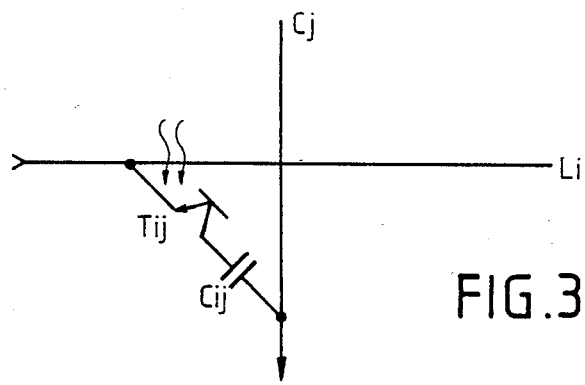
FIG. 3 shows a symbolic view of a dot of a photosensitive matrix according to the invention.

FIG. 3 gives a symbolic view of a photosensitive dot of a matrix according to the invention.

The photodiode Dij is replaced by a very particular type of phototransistor Tij which (like most phototransistors) has the advantage of having photoelectrical sensitivity greater than that of a PIN photodiode but which, unlike what could be expected of a phototransistor, can easily be made conductive for the reading of the stored charges.

Figure 4:
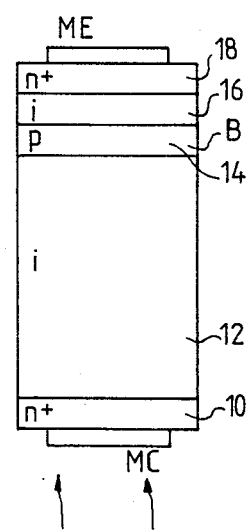
FIG. 4 shows the general structure of the phototransistor used in the matrix according to the invention.

The phototransistor preferably used according to the invention is shown in FIG. 4. It has a superimposition of five semiconducting layers of different types of conductivity. These layers are, successively:

a collecting layer 10 doped with a first type of conductivity;

a first intrinsic layer 12;

a base layer 14 of a second type of conductivity opposite to the first type of conductivity;

a second intrinsic layer 16;

an emitting layer 18 doped with the first type of conductivity.

The emitting layer and the collecting layer may be in contact with a conductive layer, ME and MC respectively, but this is not always indispensable. In particular on the side where the phototransistor is series-connected with a capacitor, the semiconducting layer of the first type of conductivity may form an electrode of the capacitor without its being necessary to interpose a conducting metallization.

In the practical embodiments, especially for large-sized photosensitive matrices, the semiconducting layers will be made of amorphous silicon.

Preferably, the layers of the first type of conductivity have a thickness of about 100 angstroms or more. The base layer with the second type of conductivity has a thickness which is preferably about a hundred angstroms.

The first intrinsic layer 12 is far thicker than the second layer. It may be several thousands of angstroms thick, while the second layer will be 100 to 300 angstroms thick. The thinner the layer 16, the easier it is to make the phototransistor conductive in order to read the electrical charges generated by the illumination and stored by the capacitor.

The layers 14, 16 and 18 may be doped with carbon so that they are more transparent to incident light radiation, with the electrical charges having to be generated chiefly in the first intrinsic layer 12.

Besides, all the layers of amorphous silicon have to be doped with hydrogen to saturate the broken silicon bonds and thus eliminate structural defects in the semiconducting layers.

The working of the photosensitive dot is as follows: the work is done in three stages, namely an illumination stage, a reading stage and a re-setting stage.

During the illumination stage, the voltage applied between the collector and the emitter of the phototransistor is such that the collector-base junction is highly biased in reverse, the other base-emitter junction being slightly biased in reverse. The illumination generates carriers in the thickest intrinsic zone. These carriers collect at the base and turn on the emitter-base junction, thus causing a major flow of charges (which is all the greater as the transistor gain is higher). This current of charges directs the carriers to the capacitor. The number of these carriers is greater than the carriers initially generated by the illumination.

In the reading stage, generally in darkness, a voltage pulse is applied to the row or column conductor in a direction which directly biases the collector-base junction, thus enabling a discharge of charges stored during integration. The discharge current is measured on the column conductor. The bias voltage is low and is in the range of that used in the case of the photodiodes.

During the re-setting stage, initial potentials which should always be the same at the outset of the illumination, are restored. For example, the phototransistor is illuminated with a high level of illumination and a reading is done with a weaker pulse than during the reading stage.

We shall now describe practical embodiments of the invention.

Figure 5:
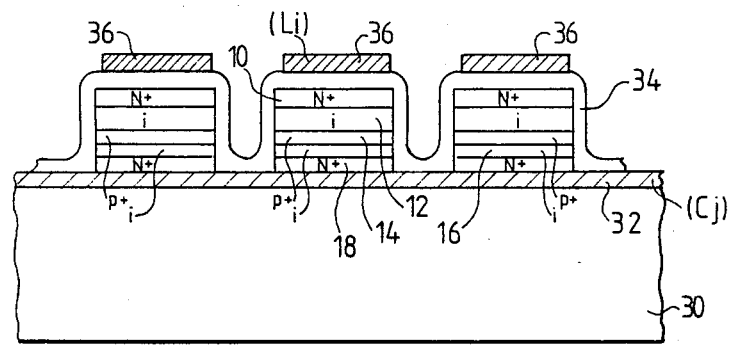
FIG. 5 shows an embodiment of a matrix according to the invention.

FIG. 5 shows a first embodiment. On an insulating substrate 30, preferably made of glass transparent to the wavelengths to which the photosensitive elements are sensitive, a first network of parallel conductors 32 is deposited. These parallel conductors 32 form, for example, the column conductors Cj of FIG. 3 (but they could also be the row conductors). The material forming these conductors is preferably a transparent material (indium-tin oxide or ITO), notably when it is desired to reset the potential of the capacitor Cij (FIG. 3) at a fixed level, by a luminous flash behind the substrate after each reading.

On the substrate thus coated with a network of row or column conductors, there will be deposited the semiconducting layers used to form the phototransistors and the insulating layers acting as the dielectric for the capacitor so as to superimpose a phototransistor and a capacitor at each dot of the matrix.

Either the phototransistor or the capacitor can be formed first. When it is the phototransistor that is formed first (FIG. 5), a deposition is made, successively, of layers of amorphous silicon corresponding to the layers 10, 12, 14, 16, 18, described with reference to FIG. 4. These layers can be deposited in this order (with the collecting layer underneath and the emitting layer on top) or in the reverse order (as in the example of FIG. 5).

This superimposition is then etched to define separate islets, each corresponding to a phototransistor which will be located on top of a portion of a conductor 32.

Then another insulating layer 34, for example made of silicon oxide or silicon nitride, is deposited. This insulating layer 34 will act as a dielectric for the capacitor. This layer covers the islets and protects the junctions on the edges of the islets.

Finally, a conducting layer 36, which is transparent or semi-transparent if the illumination is done from the top, is deposited. For example, the layer 36 is made of indium-tin oxide. It is etched to define a network of conductors, perpendicular to the conductors 32 and covering the islets corresponding to the phototransistors. If the conductors 32 are row conductors, then the conductors of the layer 36 are column conductors and vice versa.

The phototransistor is defined by the superimposition of amorphous silicon layers, and the capacitor superimposed on it is defined by the last layer (10) of the first type of conductor, by the insulating layer 34 and by the conducting layer 36.

Figure 6:
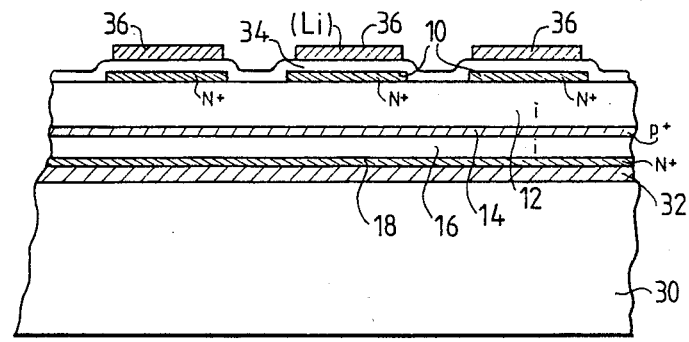
FIG. 6 shows another embodiment.

In an alternative embodiment shown in FIG. 6, it is considered to be unnecessary to completely insulate the phototransistors from one another by a complete etching of islets of amorphous silicon separated from one another. Certain layers of amorphous silicon are considered to be resistive enough, because of their low doping and/or their small thickness, for the leakage currents between adjacent islets to remain acceptable.

The embodiment of FIG. 6 is similar to that of FIG. 5, except for the fact that the operation for etching the islets of amorphous silicon after the deposition of the five successive layers 18, 16, 14, 12, 10, consists simply in etching the last layer 10 of the first type of conductivity. The intrinsic layers 12 and 16 are sufficiently resistive in view of the fact that their doping is almost null. If the base layer 14 and the emitting layer 18 are not excessively doped, they may also be considered to be sufficiently resistive owing to their small thickness. It must be seen to it that the application of a voltage pulse, capable of making the transistors connected to one and the same line Li conductive, does not turn on the transistors of the neighbouring rows conductive through the non-etched N+ layer 18.

Other alternative embodiments, in between that of FIG. 5 (with total etching of the islets) and that of FIG. 6 (with etching of only the last layer of the first type of conductivity) can be designed. As compared with the embodiment of FIG. 5, these other alternative embodiments would have the advantage of improving the planarization of the surface of the structure after the amorphous silicon islets are formed, thus making it easier to deposit and etch the conductors 36, but would have the disadvantage of causing deterioration, to a variable extent, in the insulation between photosensitive dots of the matrix.

For example, it may be provided that there will be a deposition of the first layer of the first type of conductivity (layer 18 in the case of FIG. 5) and then an etching of this layer in separate islets or in strips superimposed on the conducting strips 32, followed by a deposition of the following layers, 16, 14, 12, 10. If necessary, there could be provision for an etching of the layer 14 in separate islets, before the following intrinsic layer 12 is deposited.

Figure 7:
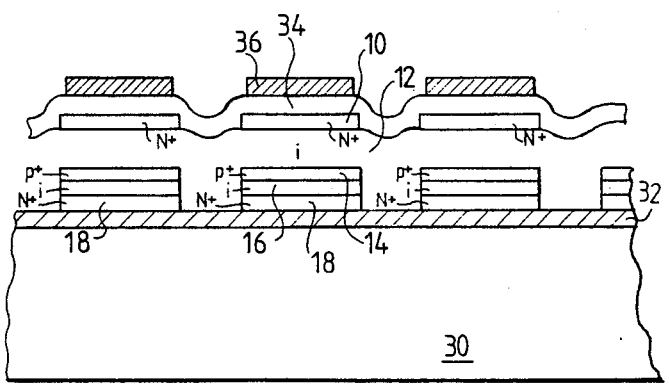
FIG. 7 shows a third embodiment.

Since it is the intrinsic layer 12 on the collector side which is the thickest one and which therefore constitutes the biggest problem as regards planarization, there could be provided a structure such as that of figure 7 in which only the layer 12 is deposited without etching. This structure has the advantage of minimizing the number intermediate etching steps while, at the same time, preventing leakages through the emitter, collector and base layers which are the most conductive ones owing to their doping and while, at the same time, achieving planarization of the structure in a wholly favorable manner.

The method for manufacturing phototransistors in the example of FIG. 7 consists in depositing, firstly, the first three layers of amorphous silicon 18, 16, 14, then in etching them in the form of islets, then in depositing the thick intrinsic layer 12 and the collecting layer 10 and, finally, in etching the collecting layer 10 only in the form of islets.

If it is preferred to form the capacitor beneath the phototransistor and not above it (for example, to prevent a loss of radiation in the dielectrical layer 34) the following procedure is followed. Firstly, the conducting layer 32 is deposited and etched as above to define conducting strips which may be rows or columns. Then, the dielectric layer 34 is deposited. This dielectric layer 34 is made, for example, of silicon oxide or nitride. Then the phototransistors are formed by depositing and etching successive layers of amorphous silicon (in the order of those FIG. 5 or in the reverse order) with complete etching of the amorphous silicon islets or with incomplete etching as in FIG. 6, with intermediate etching as in FIG. 7 or without intermediate etching. Finally, the conducting layer 36 is deposited and etched in strips perpendicular to the strips of the layer 32, these perpendicular strips covering the phototransistors.

When the photosensitive dot has a phototransistor oriented as in FIG. 3, namely wherein the collecting layer (the layer adjacent to the thickest intrinsic layer) is located on the column conductors side while the emitting layer is located on the row conductors side, a photosensitive dot (or more exactly of a row of dots is addressed by the application of a voltage pulse which is sufficiently positive (for an NIPIN phototransistor) on the row conductor. However, an example can also be envisaged where the collecting layer is located on the row conductors side.

It should be noted that it is preferable for the illumination to be done on the side of the thickest intrinsic layer. If the photosensitive matrice is associated with a scintillator, which receives a radiation at a wavelength to which the phototransistor is not sensitive, and which converts it into a radiation to which it is sensitive, the scintillator may be deposited on top of the finished structure or, again, between the substrate and the phototransistor. As the case may be, the thickest intrinsic layer will be on top of or beneath the thinnest layer.

The invention can be applied, in particular, to devices for taking X-ray pictures and especially to devices for taking large-sized X-ray pictures for medical applications, but it can also be applied, more generally, to all types of devices used to convert images into electrical signals.

What is claimed is:

1. A network of photosensitive cells arranged in rows and columns, each of said cells being located at the intersection of a respective row conductor and a respective column conductor, and wherein each of said cells comprises a series arrangement of a capacitor and an open base. phototransistor, said series arrangement being connected between the respective row conductor and the respective column conductor of each of said cells, said phototransistor comprising a superimposition of at least four semiconductor layers including:
   a first type conductivity first layer;
   a second layer of very low doping which is substantially an intrinsic semiconductor;
   a second conductivity type third layer opposite to said first type layer;
   a very low doping fourth layer which is substantially intrinsic.

2. A network of photosensitive cells according to claim 1, wherein said phototransistor further comprises a fifth layer having a first conductivity type doping.

3. A network of photosensitive cells according to any one of the claims 1 or 2, wherein said capacitor has a dielectric layer in contact with an end layer of said superimposition of layers.

4. A network of photosensitive elements according to claim 1, wherein one of said second and said fourth layers is substantially thicker than the other of said second and fourth layers.

5. A network of photosensitive elements according to claim 4, wherein the thinnest of said second and fourth layers has a thickness of on the order of hundreds of angstroms.

6. A network of photosensitive elements according to claim 4, wherein the thickest of said second and fourth layers has a thickness on the order of thousands of angstroms.

7. A network of photosensitive elements according to any one of claims 1 or 2, wherein said phototransistors made of a stack of layers of amorphous silicon.

8. A network of photosensitive elements according to any one of claims 1 or 2, wherein said phototransistors made of a stack of amorphous silicon layers including said four layers wherein at least one of said second and fourth layers remain unetched and at least said first layer is etched.

* * * * *